(12) United States Patent
Green et al.

(10) Patent No.: US 8,688,061 B2
(45) Date of Patent: Apr. 1, 2014

(54) SYSTEM AND METHOD FOR BIASING A POWER AMPLIFIER

(75) Inventors: Duane A. Green, Hiawatha, IA (US); Weiwei Shu, Burlington, MA (US); David Sawatzky, Lisbon, IA (US)

(73) Assignee: Skyworks Solutions, Inc., Woburn, MA (US)

( * ) Notice: Subject to any disclaimer, the term of this patent is extended or adjusted under 35 U.S.C. 154(b) by 651 days.

(21) Appl. No.: 12/852,536

(22) Filed: Aug. 9, 2010

(65) Prior Publication Data

US 2012/0034956 A1 Feb. 9, 2012

(51) Int. Cl.
H04B 1/04 (2006.01)
H03G 3/30 (2006.01)
H03F 3/21 (2006.01)

(52) U.S. Cl.
USPC .............. 455/127.1; 455/127.2; 330/285; 330/296

(58) Field of Classification Search
USPC .............. 455/127.1, 127.2, 127.3, 127.5; 330/285, 288, 289, 296
See application file for complete search history.

(56) References Cited

U.S. PATENT DOCUMENTS

| 5,099,154 | A | 3/1992 | Lagoni |
| 5,311,143 | A | 5/1994 | Soliday |
| 5,432,473 | A | 7/1995 | Mattila et al. |
| 6,624,703 | B1 * | 9/2003 | Chang et al. ............... 330/307 |
| 6,784,748 | B1 * | 8/2004 | Canyon et al. ............ 330/296 |
| 6,831,517 | B1 * | 12/2004 | Hedberg et al. ........... 330/285 |
| 6,922,107 | B1 | 7/2005 | Green |
| 6,967,533 | B2 * | 11/2005 | Vilhonen et al. .......... 330/254 |
| 7,459,969 | B2 * | 12/2008 | Pan .............................. 330/51 |
| 2004/0164803 | A1 * | 8/2004 | Canyon et al. ............ 330/285 |
| 2006/0006947 | A1 | 1/2006 | Feng |
| 2008/0036532 | A1 * | 2/2008 | Pan .............................. 330/51 |

OTHER PUBLICATIONS

W.S. et al. "A Monolithic Transformer Coupled 5-W Silicon Power Amplifier with 59% PAE at 0.9 GHz". IEEE Journal of Solid-State Circuits, vol. 34, No. 12, Dec. 1999. pp. 1881-1892.
International Search Report and Written Opinion re International Application No. PCT/US2011/046971 mailed on Jan. 13, 2013.

* cited by examiner

*Primary Examiner* — Blane J Jackson
(74) *Attorney, Agent, or Firm* — Knobbe Martens Olson & Bear LLP

(57) ABSTRACT

A system and method for biasing a power amplifier includes a power amplifier having a driver stage and an output stage, the driver stage having a plurality of driver devices, a bias current source configured to deliver a bias current to each of the plurality of driver devices, and a current directing element configured to receive the bias current and selectively bias each of the plurality of driver devices based on a reference voltage and a system voltage.

12 Claims, 5 Drawing Sheets

SYSTEM AND METHOD FOR BIASING A POWER AMPLIFIER

BACKGROUND

Portable communication devices, such as cellular telephones, use one or more power amplifiers to amplify an information signal prior to transmission. Modern communications systems use advanced modulation schemes, which are both phase and amplitude modulated, to boost information transmission rates, generally at the expense of power consumption. Generally, a linear power amplifier is used for systems that use phase and amplitude modulation (such as systems that employ code division multiple access (CDMA) or enhanced data rates for GSM evolution (EDGE)), while a non-linear power amplifier is used for systems that employ phase only modulation (i.e., a constant envelope modulation system such as Gaussian mean shift keying (GMSK) modulation). A linear power amplifier has significantly lower power efficiency than a non-linear power amplifier. In some communication systems, such as CDMA and wideband CDMA (WCDMA), power consumption is further increased because the linear power amplifier has to operate properly over a wide dynamic range due to CDMA/WCDMA power control requirements. For example, the dynamic range of a WCDMA system can be on the order of −50 dBm to 27 dBm.

The power amplifier is typically implemented as one or more stages of transistors and related circuitry. In most applications, the operating point of the power amplifier is set by providing a bias current or voltage to at least one of the terminals of at least one of the stages of the power amplifier. In the case of a bipolar junction transistor (BJT) the bias current is normally applied to the base terminal of the transistor to control how the transistor will conduct between its collector and emitter terminals. In a typical implementation, the power amplifier comprises one or two driver stages followed by an output stage.

A commonly used method is to control bias current and collector voltage by incorporating a bias current controller and a voltage regulator, sometimes referred to as a "buck-boost" converter. By separately controlling the bias current and collector voltage, the power efficiency of the power amplifier can be optimized.

In some implementations, the radio frequency input to the power amplifier can be provided from a transceiver to one or more of the driver stages. The transceiver is typically located on a separate structure from the power amplifier. In some power amplifier implementations, the driver stage of the power amplifier may contain multiple instances of the driver circuitry so that the power amplifier can be used in more than one communication topology. For example, a single power amplifier device can be implemented to operate in a non-linear topology, such GMSK, and in a linear topology, such as CDMA/WCDMA or EDGE. The non-linear amplifier driver circuitry can be optimized for low power, high gain operation, while the linear amplifier driver circuitry can be optimized for high power, low gain operation.

Unfortunately, the transceiver that drives the power amplifier is typically inefficient at lower power levels, thereby making it difficult for a single transceiver device to operate efficiently with the multiple instances of the power amplifier driver circuitry.

Therefore, it would be desirable to improve the efficiency of a communication system to increase battery time, namely, cellular phone talk time.

SUMMARY

Embodiments of the invention include a system for biasing a power amplifier comprising a power amplifier having a driver stage and an output stage, the driver stage having a plurality of driver devices, a bias current source configured to deliver a bias current to each of the plurality of driver devices, and a current directing element configured to receive the bias current and selectively bias each of the plurality of driver devices based on a reference voltage and a system voltage.

Other embodiments are also provided. Other systems, methods, features, and advantages of the invention will be or become apparent to one with skill in the art upon examination of the following figures and detailed description. It is intended that all such additional systems, methods, features, and advantages be included within this description, be within the scope of the invention, and be protected by the accompanying claims.

BRIEF DESCRIPTION OF THE FIGURES

The invention can be better understood with reference to the following figures. The components within the figures are not necessarily to scale, emphasis instead being placed upon clearly illustrating the principles of the invention. Moreover, in the figures, like reference numerals designate corresponding parts throughout the different views.

DETAILED DESCRIPTION

Although described with particular reference to a portable transceiver, the system and method for biasing a power amplifier can be implemented in any device that uses a power amplifier. Further, in particular embodiments, the transistors to be described below comprise bipolar junction transistors (referred to as a BJT), which includes heterojunction bipolar junction transistors (referred to as an HBT) and field effect transistors (referred to as a FET) that are fabricated using what is referred to as the bipolar complementary metal oxide semiconductor (BiCMOS) process. Further, in alternative embodiments, the circuitry to be described below can be fabricated using an integrated bipolar-field effect transistor (BIFET) process utilizing the relative lower turn-on voltage of FET transistors.

The system and method for biasing a power amplifier reduces the total system current by maximizing power amplifier gain at lower power levels without consuming additional current. Thus, the output of a transceiver coupled to the power amplifier can be reduced at low power levels. As a result, the transceiver consumes less current and the system current consumption is reduced thus increasing cellular phone talk time.

The system and method for biasing a power amplifier is generally implemented in hardware. However, one or more of the signals that control the system and method for biasing a power amplifier can be implemented in software, or a combination of hardware and software. When implemented in hardware, the system and method for biasing a power amplifier can be implemented using specialized hardware elements. When one or more of the control signals for the system and method for biasing a power amplifier are generated at least partially in software, the software portion can be used to precisely control the operating aspects of various components in a power amplifier bias circuit associated with a communications device. The software can be stored in a memory and executed by a suitable instruction execution system (microprocessor). The hardware implementation of the system and method for biasing a power amplifier can include any or a combination of the following technologies, which are all well known in the art: discrete electronic components, a discrete logic circuit(s) having logic gates for implementing logic functions upon data signals, an application specific integrated circuit having appropriate logic gates, a programmable gate array(s) (PGA), a field programmable gate array (FPGA), a separate, specially designed integrated circuit for biasing purposes, etc.

Figure 1:
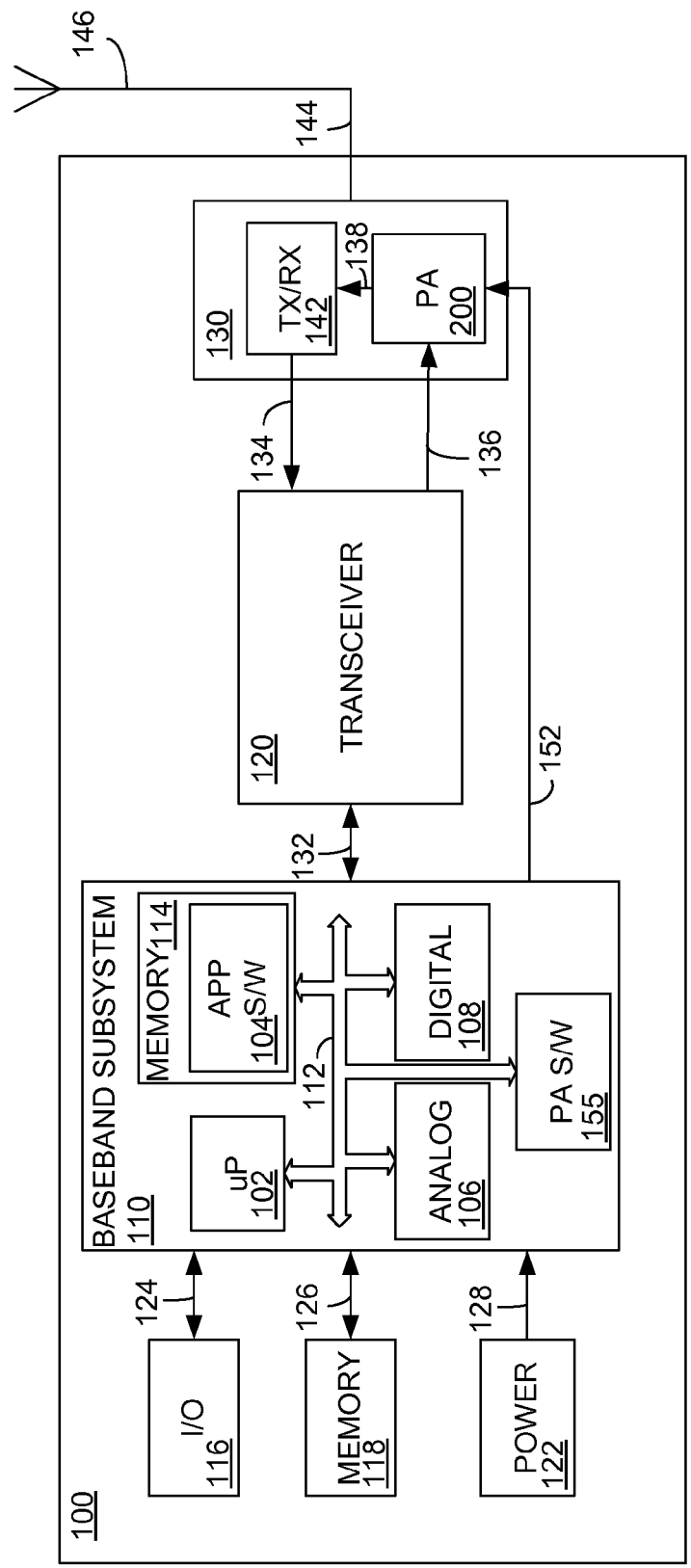
FIG. 1 is a block diagram illustrating a simplified portable communication device.

FIG. 1 is a block diagram illustrating a simplified portable communication device 100. In an embodiment, the portable communication device 100 can be a portable cellular telephone. Embodiments of the system and method for biasing a power amplifier can be implemented in any device having an RF transmitter, and in this example, are implemented in a portable communication device 100. The portable communication device 100 illustrated in FIG. 1 is intended to be a simplified example of a cellular telephone and to illustrate one of many possible applications in which the system and method for biasing a power amplifier can be implemented. One having ordinary skill in the art will understand the operation of a portable cellular telephone, and, as such, implementation details are omitted. The portable communication device 100 includes a baseband subsystem 110, a transceiver 120, and a front end module (FEM) 130. Although not shown for clarity, the transceiver 120 generally includes modulation and upconversion circuitry for preparing a baseband information signal for amplification and transmission, and includes filtering and downconversion circuitry for receiving and downconverting a received RF signal to a baseband information signal to recover data. The details of the operation of the transceiver 120 are known to those skilled in the art.

The baseband subsystem generally includes a processor 102, which can be a general purpose or special purpose microprocessor, memory 114, application software 104, analog circuit elements 106, digital circuit elements 108 and power amplifier software 155, coupled over a system bus 112. The system bus 112 can include the physical and logical connections to couple the above-described elements together and enable their interoperability.

An input/output (I/O) element 116 is connected to the baseband subsystem 110 over connection 124, a memory element 118 is coupled to the baseband subsystem 110 over connection 126, and a power source 122 is connected to the baseband subsystem 110 over connection 128. The I/O element 116 can include, for example, a microphone, a keypad, a speaker, a pointing device, user interface control elements, and any other device or system that allows a user to provide input commands and receive outputs from the portable communication device 100.

The memory 118 can be any type of volatile or non-volatile memory, and in an embodiment, can include flash memory. The memory element 118 can be permanently installed in the portable communication device 100, or can be a removable memory element, such as a removable memory card.

The power source 122 can be, for example, a battery, or other rechargeable power source, or can be an adaptor that converts AC power to the correct voltage used by the portable communication device 100. In an embodiment, the power source can be a battery that provides a nominal voltage output of approximately 3.0 volts (V). However, the output voltage range of the power source can range from approximately 1.0 to 5.0 V.

The processor 102 can be any processor that executes the application software 104 to control the operation and functionality of the portable communication device 100. The memory 114 can be volatile or non-volatile memory, and in an embodiment, can be non-volatile memory that stores the application software 104. If portions of the control logic of the system and method for biasing a power amplifier are implemented in software, then the baseband subsystem 110 also includes power amplifier software 155, which may cooperate with control logic that can be executed by the microprocessor 102, or by another processor, to control at least some aspects of the operation of the system and method for biasing a power amplifier and/or the power amplifier 200 to be described below.

The analog circuitry 106 and the digital circuitry 108 include the signal processing, signal conversion, and logic that convert an input signal provided by the I/O element 116 to an information signal that is to be transmitted. Similarly, the analog circuitry 106 and the digital circuitry 108 include the signal processing, signal conversion, and logic that convert a received signal provided by the transceiver 120 to an information signal that contains recovered information. The digital circuitry 108 can include, for example, a digital signal processor (DSP), a field programmable gate array (FPGA), or any other processing device. Because the baseband subsystem 110 includes both analog and digital elements, it is sometimes referred to as a mixed signal device (MSD).

In an embodiment, the front end module 130 includes a transmit/receive (TX/RX) switch 142 and a power amplifier 200. The TX/RX switch 142 can be a duplexer, a diplexer, or any other physical or logical device or circuitry that separates a transmit signal and a receive signal. Depending on the implementation of the portable communication device 100, the TX/RX switch 142 may be implemented to provide half-duplex or full-duplex functionality. A transmit signal provided by the transceiver 120 over connection 136 is directed to the power amplifier 200. As will be described in detail below, the power amplifier 200 can be implemented to include a bias element for generating a bias signal, typically in the form of a bias current that can be based on system voltage and a reference voltage, to the power amplifier. The output of the power amplifier 200 is provided over connection 138 to the TX/RX switch 142, and then to an antenna 146 over connection 144.

A signal received by the antenna 146 is provided over connection 144 to the TX/RX switch 142, which provides the received signal over connection 134 to the transceiver 120.

In an embodiment, the baseband subsystem 110 provides one or more control signals to the power amplifier 200 over connection 152. Connection 152 can be implemented as discrete connections, or as a bus having multiple signals.

Figure 2:
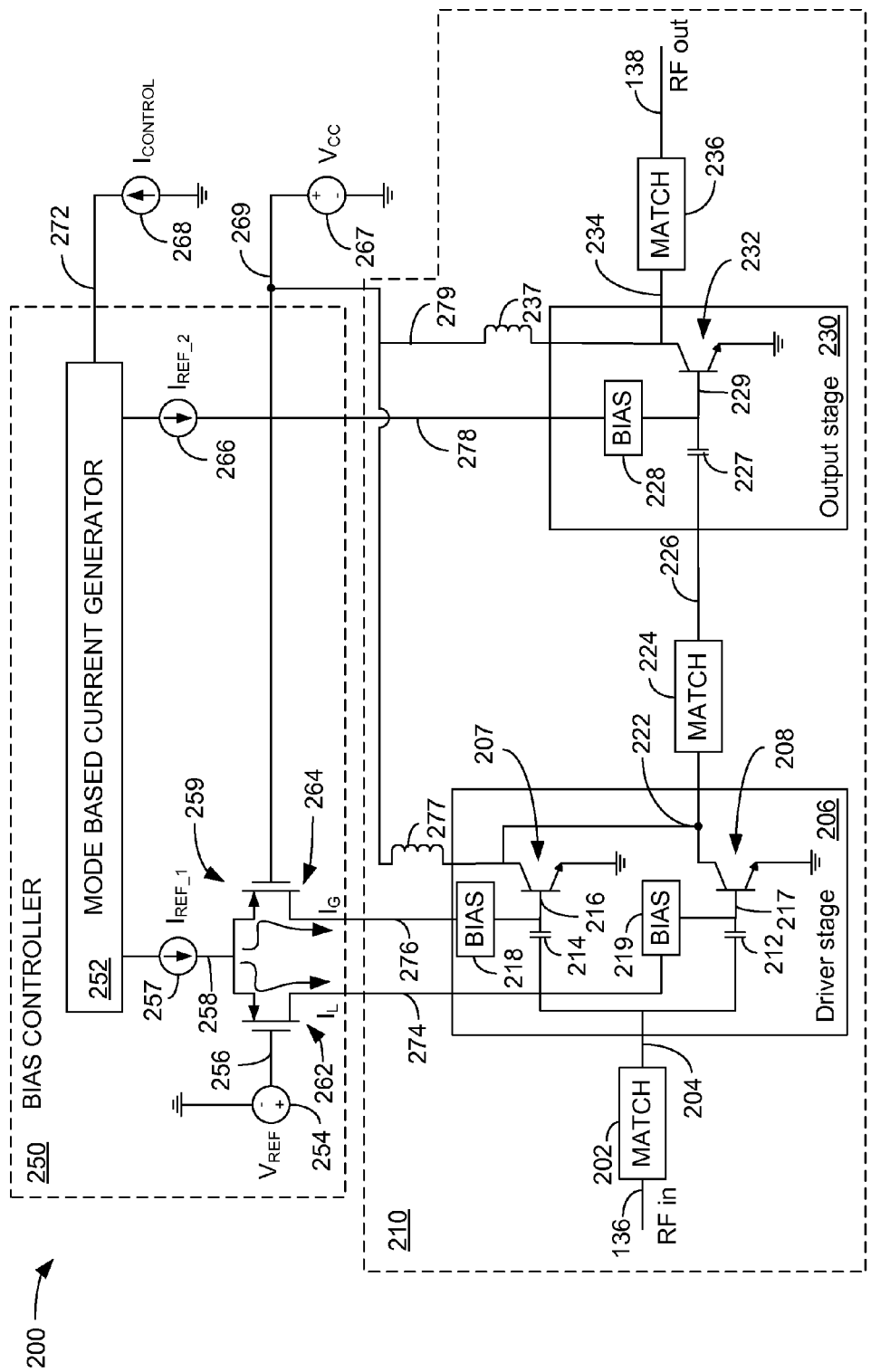
FIG. 2 is a schematic diagram illustrating an embodiment of the power amplifier of FIG. 1.

FIG. 2 is a schematic diagram illustrating an embodiment of the power amplifier 200 of FIG. 1. The power amplifier 200 comprises a power amplifier portion 210 and a bias controller 250. Although shown schematically as part of the power amplifier 200, the bias controller 250 may be fabricated and implemented separately from the power amplifier portion 210.

The power amplifier portion 210 includes a number of power amplifier stages. In the embodiment shown in FIG. 2, the power amplifier portion 210 comprises a driver stage 206 and an output stage 230. However, in alternative embodiments, more than one driver stage may be implemented. Typically, one or two driver stages are implemented with a single output stage. The driver stage 206 is capable of operation in more than one transmission methodology and, as such, comprises transistors 207 and 208. In an embodiment, the driver stage 206 can operate in the GMSK transmission methodology and in the WCDMA/EDGE transmission methodology. While differences exist within each broad methodology, the GMSK transmission methodology generally uses power amplification having a non-linear control characteristic and the WCDMA/EDGE transmission methodology generally uses power amplification having a linear control characteristic. In the embodiment shown in FIG. 2, the transistor 207 is a high gain device particularly suited for amplifying signals in the GMSK transmission scheme and the transistor 208 is a lower gain device that is particularly suited for amplifying signals in the WCDMA or EDGE transmission scheme.

A radio frequency (RF) information signal is provided over connection 136 from the transceiver 120 of FIG. 1. The RF signal on connection 136 is passed through a matching circuit 202. As known to those skilled in the art, the matching circuit 202 may comprise a combination of resistive, capacitive and inductive elements that match the impedance of the signal on connection 136 to the impedance at the input of the driver stage 206 on connection 204. The RF input signal on connection 204 is provided concurrently to the transistors 207 and 208 through capacitors 214 and 212, respectively. The capacitors 214 and 212 provide a direct current (DC) blocking function. In the embodiment shown in FIG. 2, the transistors 207 and 208 are each implemented as a bipolar junction transistor (BJT), but this need not be limiting. Other transistor device technologies can be implemented.

The transistor 207 is connected to a bias circuit 218. The bias is circuit 218 is connected to the base terminal 216 of the transistor 207. Similarly, a bias circuit 219 is connected to the base terminal 217 of the transistor 208. As known to those skilled in the art, the bias circuits 218 and 219 contain circuitry to provide a bias current to the transistors 207 and 208, respectively. An example of the bias circuits 218 and 219 can be found in U.S. Pat. No. 6,873,211, which is incorporated herein by reference.

The RF output of the driver stage 206 is taken from the collector terminal of the transistor 207 and the collector terminal of the transistor 208, which are tied together at node 222. The output of the driver stage 206 is provided to a matching circuit 224. The matching circuit 224 is designed to provide an impedance match between the RF signal on connection 222 and the RF signal on connection 226. The RF signal on connection 226 is provided through a DC blocking capacitor 227 to the base terminal 229 of the transistor 232. A bias signal is applied to the base terminal 229 of the transistor 232 from bias circuitry 228. An example of the bias circuit 228 can be found in U.S. Pat. No. 6,873,211, which is incorporated herein by reference. The RF output of the output stage 230 is provided from the collector terminal of the transistor 232 over connection 234. The RF output signal on connection 234 is provided to matching circuit 236, which matches the impedance of the RF signal on connection 234 with the TX/RX switch impedance (not shown) on connection 138.

A system voltage, $V_{CC}$, is provided on connection 269 by a voltage source 267. In an embodiment, a nominal system voltage can be approximately 3.0V. The collector terminal 234 of the transistor 232 is coupled to the system voltage, $V_{CC}$, through an inductor 237. The collector terminal 222 of the transistor 207 and the collector terminal 222 of the transistor 208 are coupled through an inductor 277 to the system voltage, $V_{CC}$, on connection 269.

The bias controller 250 comprises a mode based current generator 252, a reference voltage source 254, a current source 257, a current source 266 and a differential amplifier 259.

The mode based current generator 252 receives a control current, $I_{CONTROL}$, from a current source 268 over connection 272 and allows the current source 257 to develop a first reference current, $I_{REF\_1}$, and allows the current source 266 to develop a second reference current, $I_{REF\_2}$. These reference currents are directly proportional to $I_{CONTROL}$. The scaling between $I_{REF\_1}$ and $I_{REF\_2}$ depends on the mode of operation (e.g., GMSK, EDGE or WCDMA) and can be implemented to suit a variety of applications.

The current source 266 provides a bias control current, $I_{REF\_2}$, over connection 278 to the bias circuit 228. The current source 257 provides a bias control current, $I_{REF\_1}$, over connection 258 to the differential amplifier 259. The differential amplifier 259 comprises a transistor device 262 and a transistor 264. The transistor 262 and the transistor 264 can be implemented as field effect transistor (FET) devices. However, other transistor device technologies may be implemented.

The gate terminal of the transistor 262 is coupled to a reference voltage, $V_{REF}$, provided by the voltage source 254 over connection 256. In an embodiment, a nominal reference voltage, $V_{REF}$, can be approximately 1.8V. The gate terminal of the transistor 264 receives the system voltage, $V_{CC}$, over connection 269. The source terminal of the transistor 262 and the source terminal of the transistor 264 are coupled together at connection 258 and receive the current, $I_{REF\_1}$. The drain terminal of the transistor 262 is coupled to the bias circuit 219 over connection 274 and the drain terminal of the transistor 264 is coupled to the bias circuit 218 over connection 276.

In accordance with an embodiment of the system and method for biasing a power amplifier, the bias current, $I_{REF\_1}$, provided over connection 258 is provided through the differential amplifier 259 and communicated to connection 274 and connection 276 based on a difference between the reference voltage, $V_{REF}$, applied to the gate of the transistor 262 and the system voltage, $V_{CC}$, applied to the gate of the transistor 264. The differential amplifier acts as a "soft switch" to "steer" the current on connection 258 to the connections 274 and 276 based on the relative levels of $V_{REF}$ and $V_{CC}$. By using the system voltage, $V_{CC}$, and an available reference voltage, $V_{REF}$, the system and method for biasing a power amplifier can be incorporated into an existing power amplifier bias profile without using an additional logic pin, thus simplifying the transceiver logic design.

The current directed onto connection 274 is referred to as $I_L$, and is the portion of $I_{REF\_1}$ that is steered by the transistor 262. The current $I_L$ biases the transistor 208. The current directed onto connection 276 is referred to as $I_G$, and is the portion of $I_{REF\_1}$ that is steered by the transistor 264. The current $I_G$ biases the transistor 207.

At full or near-full transmit power the transistor 208 has a better noise floor and provides better linearity (e.g., better adjacent channel power rejection (ACPR)) than does the transistor 207. The drawback of using the transistor 208 at low power levels is that it provides relatively low gain under similar bias conditions. In such a mode, the transceiver 120 (FIG. 1) has to output additional power to compensate for the low gain, and therefore consumes more system current.

At low transmit power levels, the differential amplifier 259 directs less current, $I_L$, to the transistor 208 and more current, $I_G$, to the transistor 207. In this manner, and in certain implementations, the overall gain of the power amplifier 200 can be increased by about 6 dB without decreasing the efficiency of the power amplifier. This is so because the transistor 208 is sized differently than the transistor 207 and typically incorporates feedback to improve the noise floor and linearity (ACPR) at the expense of lower gain. The transistor 207, on the other hand, is sized for higher gain and is not limited by feedback circuitry, thereby allowing the transceiver 120 (FIG. 1) to reduce its power output level at low transmit power levels if the transistor 207 is used at the low power level.

At full power, the system voltage, $V_{CC}$, is about 3V and substantially all of the current, $I_{REF\_1}$, from the differential amplifier 259 flows through the transistor 262 as the current, $I_L$, to bias the transistor 208. As the power level steps down, the system voltage, $V_{CC}$, becomes smaller and the differential amplifier 259 starts steering a fraction of the current, $I_{REF\_1}$, through the transistor 264 as the current, $I_G$, to bias the transistor 207. When $V_{CC}=V_{REF}$, the transistor 207 and the transistor 208 each receive one half of the current, $I_{REF\_1}$. Further decreasing $V_{CC}$ causes more current, $I_G$, to flow into the base of the transistor 207.

Because the transistor 207 has high gain at low power, at lower system voltage levels it is desirable to allow the transistor 207 to be favorably biased as compared to the transistor 208, so that the transistor 207 can use its high gain at low power to allow the transceiver 120 to provide an RF input signal at a lower system voltage level. In this manner, while at lower system voltage levels, the output of the transceiver 120 (FIG. 1) can be reduced, thereby lowering the overall system current consumption. As the system voltage level $V_{CC}$ increases, the difference between $V_{REF}$ and $V_{CC}$ changes such that the current, $I_{REF\_1}$, on connection 258 is directed through the transistor 262 and onto connection 274, so that at higher system voltage levels, the transistor 208 will be favorably biased, thereby using the transistor 208 as the driver stage at higher system voltage levels.

Further, even at higher system voltage levels, providing a certain amount current into the transistor 207 is beneficial to the overall operation of the driver stage 206. Providing even a small amount of current, $I_G$, to bias the transistor 207 at higher system voltage levels improves the power added efficiency (PAE) and the adjacent channel power rejection (ACPR) of the transistor 208 under varying load conditions. In an embodiment, it was noticed that injecting 80 micro amperes (µA) of bias current, $I_G$, to the transistor 207 results in ~3% PAE improvement in the transistor 208 along with good ACPR.

Further, using the differential amplifier 259 as a "soft switch" eliminates potential signal phase and gain discontinuities that would likely occur when using a discrete on-off switch to control the bias signal provided to the transistor 207 and to the transistor 208. It may be difficult for the system to compensate for these discrete on-off switch discontinuities in order to maintain signal integrity and/or appropriate power control stability/tolerance.

Figure 3:
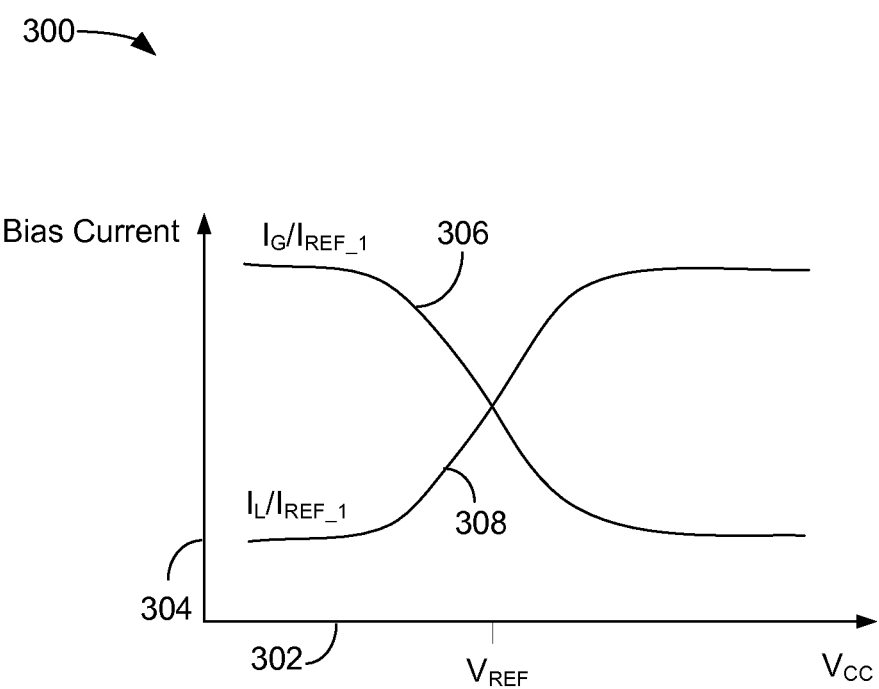
FIG. 3 is a graphical illustration showing the bias current provided by the differential amplifier of FIG. 2 as a function of the system voltage level, $V_{CC}$.

FIG. 3 is a graphical illustration showing the bias current provided by the differential amplifier 259 as a function of the system voltage level $V_{CC}$. The abscissa 302 shows the system voltage, $V_{CC}$, while the ordinate 304 shows the bias current provided by the differential amplifier 259. The trace 306 represents the bias current $I_G$ on connection 276 while the trace 308 illustrates the bias current $I_L$ on connection 274.

When the system voltage, $V_{CC}$, is equal to the reference voltage, $V_{REF}$, the current, $I_L$, through the transistor 262 is equal to the current, $I_G$, through the transistor 264. As the system voltage, $V_{CC}$, drops below the reference voltage, $V_{REF}$, significantly more current flows through connection 276 to bias the transistor 207. Conversely, as the system voltage, $V_{CC}$, rises above the reference voltage, $V_{REF}$, significantly more current flows through connection 274 to bias the transistor 208. In this manner, a soft switching function is provided by the differential amplifier 259 that allows the favorable low-power, high gain attributes of the transistor 207 to be used as the driver stage at low system voltage levels, and allows the favorable high-power, low gain attributes of the transistor 208 to be used as the driver stage at high system voltage levels. In this manner, at lower system voltage levels, the low-power, high gain attributes of the transistor 207 allow the power output of the transceiver 120 to be significantly less than the power output of the transceiver 120 when the transistor 208 is used as the driver stage. In this manner, the low-power, high gain attributes of the transistor 207 allow the power output of the transceiver 120 to be minimized, thereby reducing overall system power consumption.

Figure 4:
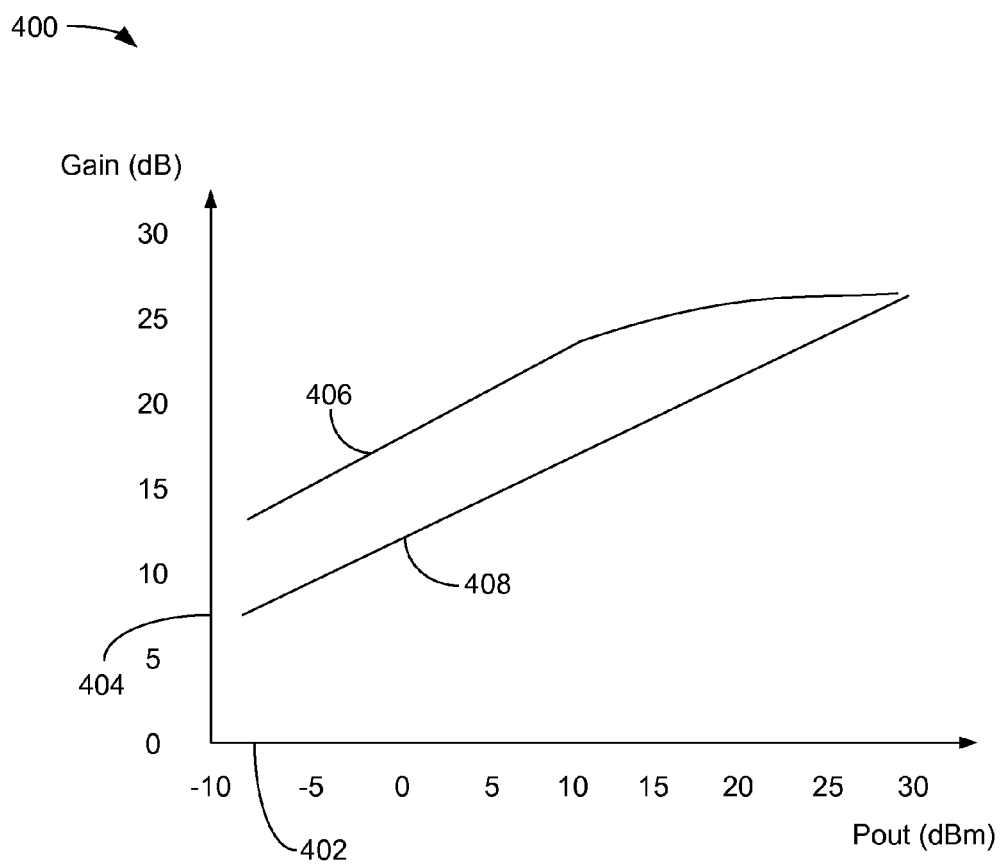
FIG. 4 is a graphical illustration comparing a gain profile of the power amplifier of FIG. 2 with a gain profile of a power amplifier that lacks the bias architecture shown in FIG. 2.

FIG. 4 is a graphical illustration comparing a gain profile of the power amplifier 200 with a gain profile of a power amplifier that lacks the bias architecture shown in FIG. 2. The abscissa 402 shows power amplifier output power, Pout, in dBm, while the ordinate 404 shows power amplifier gain in dB. The trace 406 illustrates the gain profile provided by the power amplifier 200. The trace 408 illustrates a gain profile of a power amplifier that lacks the bias architecture shown in FIG. 2. Compared to the gain profile 408, the gain profile 406 provides higher gain at lower power output levels.

Figure 5:
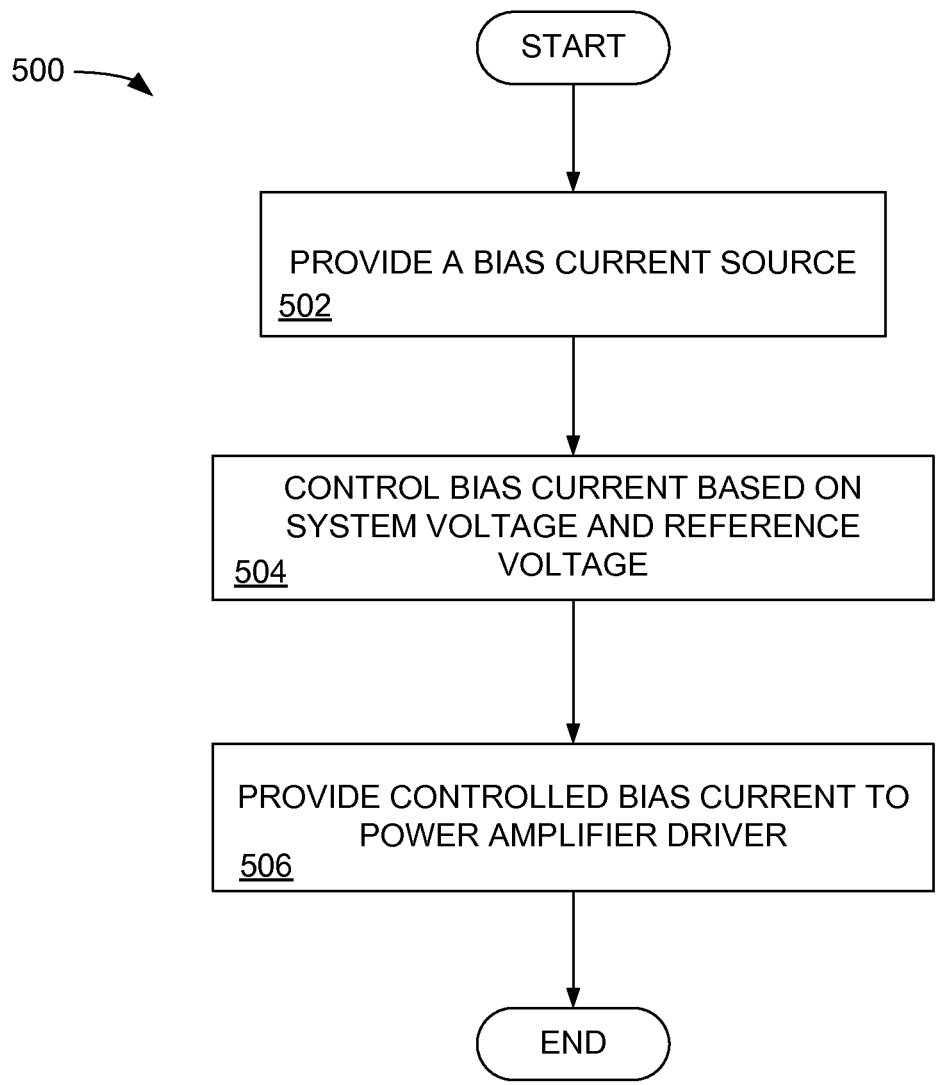
FIG. 5 is a flow chart describing the operation of an embodiment of the method of biasing a power amplifier.

FIG. 5 is a flowchart illustrating the operation of an embodiment of a method for biasing a power amplifier. The blocks in the flowchart 500 can be performed in or out of the order shown, and can also be performed in parallel.

In block 502 a bias current source is provided. For example, the bias current source can be provided by the mode-based current generator 252 and the current source 257 of FIG. 2.

In block 504, the bias current provided by the current source 257 is controlled based on the difference between the reference voltage, $V_{REF}$, provided by the voltage source 254 and the system voltage, $V_{CC}$, provided over connection 269.

In block 506, the differential amplifier 259 provides the controlled bias current to the power amplifier driver 206, depending upon the difference between the voltage reference, $V_{REF}$ and the system voltage, $V_{CC}$.

While various embodiments of the invention have been described, it will be apparent to those of ordinary skill in the art that many more embodiments and implementations are possible that are within the scope of this invention.

What is claimed is:

1. A system for biasing a power amplifier, comprising:
a power amplifier having a driver stage and an output stage, the driver stage having a plurality of driver devices;
a bias current source configured to deliver a bias current to each of the plurality of driver devices; and
a current directing element configured to receive the bias current and selectively bias each of the plurality of driver devices based on a reference voltage and a system voltage.

2. The system of claim 1, in which:
a first driver device is sized to provide a low power, high gain output; and
a second driver device is sized to provide a high power, low gain output.

3. The system of claim 2, in which:
the current directing element directs a major portion of the bias current to the first driver device when the system voltage is less than the reference voltage; and
the current directing element directs a major portion of the bias current to the second driver device when the system voltage exceeds the reference voltage.

4. The system of claim 3, further comprising a transceiver that provides a radio frequency (RF) input signal to the driver stage, wherein a power level of the RF input signal is lower when the current directing element directs a major portion of the bias current to the first driver device than when the current directing element directs a major portion of the bias current to the second driver device.

5. A portable transceiver having a system for biasing a power amplifier, comprising:
a transceiver;
a power amplifier operatively coupled to the transceiver, the power amplifier having a driver stage and an output stage, the driver stage having a plurality of driver devices;
a bias current source configured to deliver a bias current to each of the plurality of driver devices; and
a current directing element configured to receive the bias current and selectively bias each of the plurality of driver devices based on a reference voltage and a system voltage.

6. The portable transceiver of claim 5, in which:
a first driver device is sized to provide a low power, high gain output; and
a second driver device is sized to provide a high power, low gain output.

7. The portable transceiver of claim 6, in which:
the current directing element directs a major portion of the bias current to the first driver device when the system voltage is less than the reference voltage; and
the current directing element directs a major portion of the bias current to the second driver device when the system voltage exceeds the reference voltage.

8. The portable transceiver of claim 7, wherein the transceiver provides a radio frequency (RF) input signal to the driver stage, and a power level of the RF input signal is lower when the current directing element directs a major portion of the bias current to the first driver device than when the current directing element directs a major portion of the bias current to the second driver device.

9. A method for biasing a power amplifier, comprising:
providing a power amplifier having a driver stage and an output stage, the driver stage having a plurality of driver devices;
providing a bias current to each of the plurality of driver devices; and
selectively biasing each of the plurality of driver devices based on a reference voltage and a system voltage.

10. The method of claim 9, further comprising:
using a first driver device for a low power, high gain output; and
using a second driver device for a high power, low gain output.

11. The method transceiver of claim 10, further comprising:
directing a major portion of the bias current to the first driver device when the system voltage is less than the reference voltage; and
directing a major portion of the bias current to the second driver device when the system voltage exceeds the reference voltage.

12. The method of claim 11, further comprising:
providing a radio frequency (RF) input signal to the driver stage;
providing a lower power level of the RF input signal when a major portion of the bias current is directed to the first driver device.

* * * * *

UNITED STATES PATENT AND TRADEMARK OFFICE
CERTIFICATE OF CORRECTION

PATENT NO.        : 8,688,061 B2                                Page 1 of 1
APPLICATION NO.   : 12/852536
DATED             : April 1, 2014
INVENTOR(S)       : Duane A. Green It is certified that error appears in the above-identified patent and that said Letters Patent is hereby corrected as shown below:

IN THE CLAIMS:

In column 10 at line 19, In Claim 11, after "method" delete "transceiver".

Signed and Sealed this
Thirteenth Day of January, 2015

Michelle K. Lee
*Deputy Director of the United States Patent and Trademark Office*